United States Patent [19]

Nier

[11] 3,711,752

[45] Jan. 16, 1973

[54] SEMICONDUCTOR DEVICE AND METHOD OF ASSEMBLING THE SAME

[75] Inventor: Johannes Nier, 7016 Gerlingen, Germany

[73] Assignee: Robert Bosch GmbH, Stuttgart, Germany

[22] Filed: Nov. 23, 1970

[21] Appl. No.: 92,067

[30] Foreign Application Priority Data

Dec. 5, 1969 Germany.....................P 19 61 042.5

[52] U.S. Cl...........317/234 R, 317/234 N, 317/234 P

[51] Int. Cl...................................................H01l 5/00

[58] Field of Search.......................317/234; 174/52 R

[56] References Cited

UNITED STATES PATENTS

| | | | |
|---|---|---|---|
| 3,519,896 | 7/1970 | Kelly | 317/234 |
| 3,275,904 | 9/1966 | Parker | 317/234 |
| 3,390,450 | 7/1968 | Checki et al. | 29/589 |
| 3,177,413 | 4/1965 | Roka | 317/234 |

*Primary Examiner*—John W. Huckert
*Assistant Examiner*—E. Wojciechowicz
*Attorney*—Michael S. Striker

[57] ABSTRACT

The parts of a semiconductor device are assembled in a composite jig whose base can locate the heat sink and whose parts-receiving block has cavities for the solder, semiconductor pellet and elastic metallic contacts provided with elastic tongues which engage terminals on the exposed surface of the pellet. The contacts are thereupon subjected to elastic deforming stresses to clamp them to the leads of the heat sink and to bias the tongues against the pellet. The thus assembled semiconductor device is withdrawn from the jig and conveyed through a soldering furnace wherein the contacts are bonded to the leads and to the terminals simultaneously with bonding of the pellet to the heat sink.

9 Claims, 3 Drawing Figures

INVENTOR
Johannes NIER
BY
[signature]
his ATTORNEY

INVENTOR
Johannes NIER
BY
Michael S. Striker
his ATTORNEY

SEMICONDUCTOR DEVICE AND METHOD OF ASSEMBLING THE SAME

BACKGROUND OF THE INVENTION

The present invention relates to improvements in a method of assembling the parts of a semiconductor device and to a semiconductor device which is assembled in accordance with the method. The invention also relates to intermediate products which consist of certain partially assembled parts of the improved semiconductor device.

The semiconductor device of the present invention is of the type wherein contacts secured to the leads of a metallic heat sink are caused to engage terminals provided on a semiconductor pellet which is soldered to the heat sink. It is already known to solder a semiconductor pellet to a metallic base or heat sink which latter serves as a contact as well as a means for conveying heat away from the pellet. In accordance with one of the presently known methods, the semiconductor device is assembled by resorting to a so-called planar process. This involves establishing all electrical connections with the pellet at that side of the heat sink which faces away from the pellet. The heat sink is traversed by and insulated from pins which are connected to the terminals of the pellet and can be secured to conductors at the aforementioned side of the heat sink. A drawback of this prior proposal is that the contacts must be mounted and permanently secured in several stages with resultant expenditures in time and man hours. As a rule, the pellet is soldered to the heat sink in a first step and each of its terminals is thereupon connected with a conductor or yoke in a separate step. This is a time-consuming procedure which contributes significantly to the cost of the ultimate product. Furthermore, the connections between the terminals of the pellet and the conductors must be established by skilled persons and it is often necessary to resort to microscopes or other magnifying devices.

SUMMARY OF THE INVENTION

An object of the invention is to provide a novel and improved method of assembling the parts of semiconductor devices.

Another object of the invention is to provide a method according to which the parts of semiconductor devices can be assembled with substantial savings in time, material and labor.

A further object of the invention is to provide a method which can be carried out by unskilled or semiskilled persons by resorting to simple machinery.

An additional object of the invention is to provide novel and improved current-conducting contacts for use in the semiconductor device of the present invention.

Still another object of the invention is to provide an intermediate product which comprises several parts of a finished semiconductor device and enables the operators to heat the assembled device in a soldering furnace or the like without any danger of affecting the connections between current-conducting parts of the semiconductor device.

An ancillary object of the invention is to provide a novel method of temporarily securing current-conducting contacts to the leads of heat sinks in semiconductor devices.

The method of the present invention comprises the steps of locating a metallic plate-like heat sink with two insulated leads in a predetermined position with reference to a jig (preferably a jig which can be taken apart to facilitate insertion of the heat sink), placing a foil of solder into a suitably configurated cavity of the jig so that the foil overlies a predetermined portion of one side of the properly located heat sink, placing into the same cavity a semiconductor pellet with plural terminals so that the pellet overlies the foil and its terminals remain exposed, slipping an elastic metallic contact onto each lead of the heat sink so that elastic tongues provided on such contacts engage selected terminals of the pellet and that locating surfaces provided in or on the jig maintain the contacts in predetermined angular positions with reference to the respective leads, and stressing the contacts to establish a clamping action between the contacts and the respective leads and to simultaneously cause the tongues to bear against the selected terminals. The thus assembled semiconductor device can be removed from the jig and heated in a soldering furnace so as to bond the contacts to the respective leads, to bond the tongues to the respective terminals, and to bond the pellet to the heat sink. Prior to heating, solder rings are preferably slipped onto the leads to that each solder ring overlies a contact. The extent to which the contacts can be stressed prior to heating and prior to removal from the jig can be determined by a surface of the jig, for example, by that surface beyond which the leads extend. The arrangement is preferably such that, when the jig is assembled, the heat sink is located at one side while the contacts and the pellet are insertable into their cavities from the other side of a parts-receiving block of the jig.

The novel features which are considered as characteristic of the invention are set forth in particular in the appended claims. The improved semiconductor device itself, however, both as to its construction and the mode of assembling the same, together with additional features and advantages thereof, will be best understood upon perusal of the following detailed description of certain specific embodiments with reference to the accompanying drawing.

DESCRIPTION OF THE PREFERRED EMBODIMENTS

Figure 1:
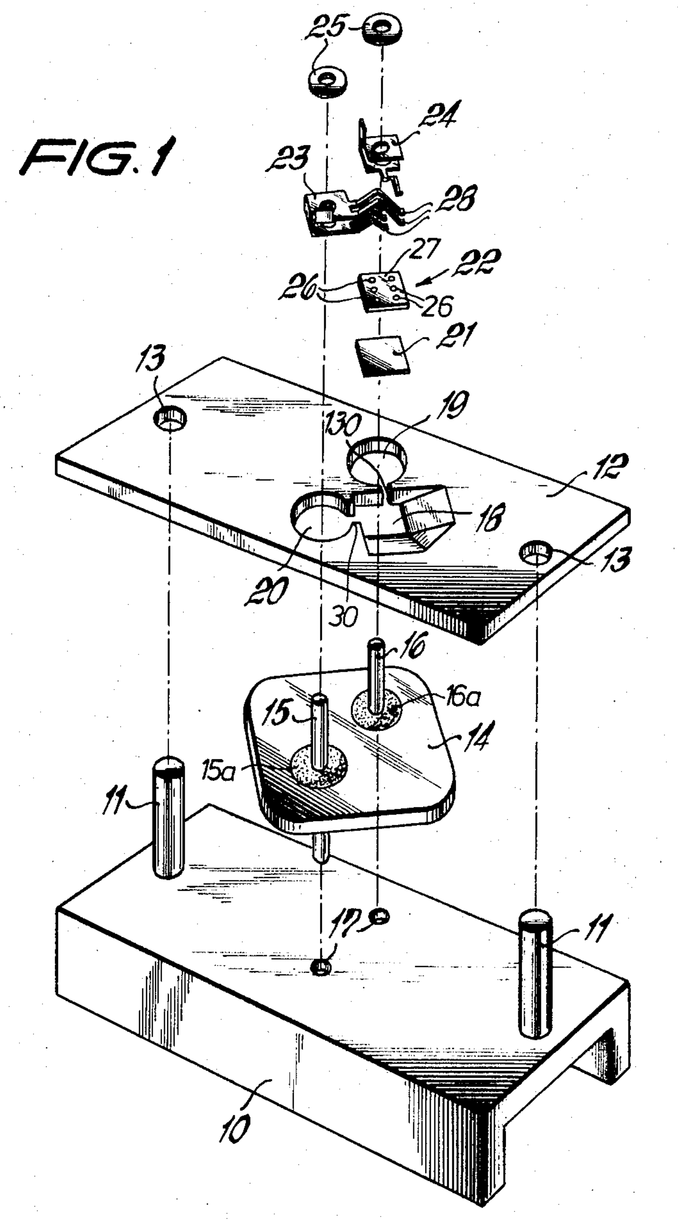
FIG. 1 is an exploded perspective view of a jig and of the parts of a semiconductor device which can be assembled in the jig.

FIG. 1 illustrates a jig which includes an inverted U-shaped support or base member 10 and a parts-receiving block 12. The base 10 has two upwardly extending pins 11 which can extend through holes 13 provided in the block 12. A substantially square plate-like metallic heat sink 14 of the semiconductor device has two parallel rod-like leads 15, 16 which are insulated from the metallic material of the heat sink by glass seals **15*a*, 16*a* or the like. The leads extend transversely beyond both sides of the heat sink 14 and their lower portions can be inserted into holes 17 provided in the base member 10 of the jig. The block 12 is thereupon slipped onto the pins 11 whereby the heat sink 14 is located in a predetermined position with reference to the thus assembled jig. The block 12 is provided with cutouts or cavities 18, 19 and 20 which serve to receive and to properly position additional parts of the semiconductor device, i.e., to properly position all such parts which are to be secured to the heat sink 14. These parts include a plate-like foil 21 of solder; a plate-like semiconductor pellet 22 having five terminals 26 and a terminal 27, all accessible at the exposed upper surface of the pellet; two elastic contacts 23, 24 of metallic material; and two solder rings 25**.

Figure 2:
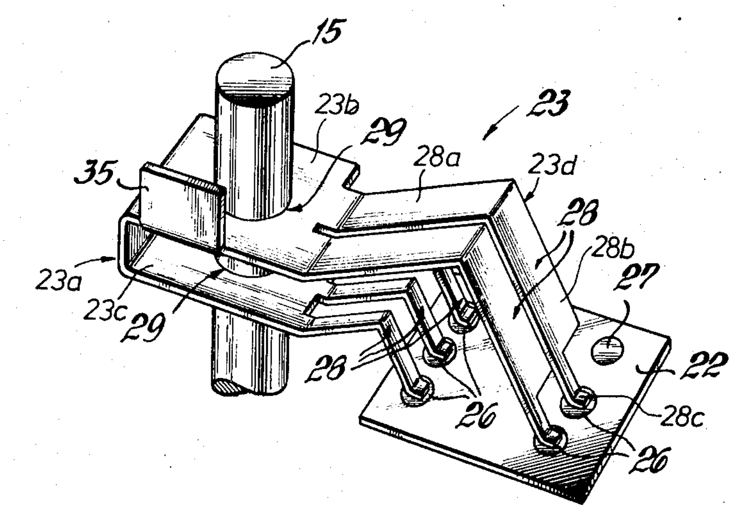
FIG. 2 is an enlarged perspective view of certain parts of the semiconductor device in assembled positions.
Figure 3:
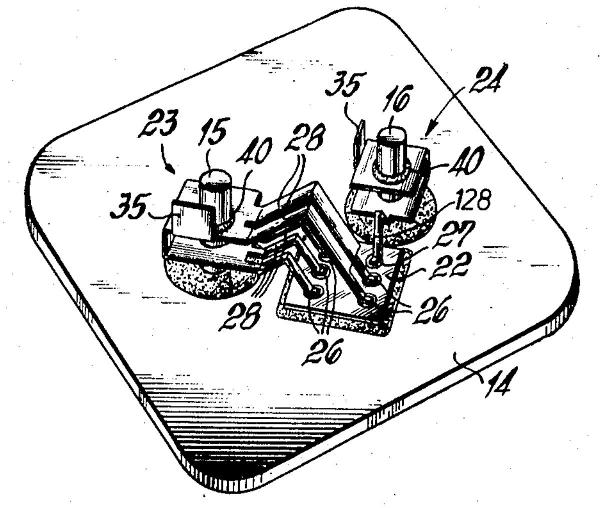
FIG. 3 is an enlarged perspective view of a fully assembled and soldered semiconductor device.

As best shown in FIGS. 2 and 3, the contact 23 includes a U-shaped first portion **23*a* having two substantially parallel flanges or legs 23*b*, 23*c* provided with registering apertures 29. The upper leg 23*b* has an upwardly extending projection or tab 35 which can be engaged by the jaws of tweezers, pincers (not shown) or analogous tools. The second portion 23*d* of the contact 23 consists of five V-shaped elastic tongues 28 each having a first section or arm 28*a* which is integral with the leg 23*b* or 23*c* and extends upwardly and away from the exposed surface of the pellet 22, a second section or arm 28*b* which is inclined downwardly toward the exposed surface of the pellet 22, and a substantially plate-like foot 23*c* provided at the free end of the section 28*b* and lying flat against the adjacent terminal 26. Each of the tongues 28 engages a different terminal 26 and these tongues are located in different planes. The contact 24 is similar to the contact 23 excepting that its second portion consists of a single tongue 128 whose foot engages the terminal 27 of the pellet 22**.

The semiconductor device (shown in assembled and soldered condition in FIG. 3) is assembled as follows:

In the first step, the heat sink 14 is mounted in the base member 10 of the jig by introducing the lower portions of the leads 15, 16 into the respective holes 17. The block 12 is thereupon placed onto the heat sink 14 so that the pins 11 extend through the respective holes 13 whereby the heat sink is located in a predetermined position with reference to the assembled jig. The upper portions of the leads 15, 16 then extend with clearance through the cavities 20, 19 of the block 12.

In the next step, the foil 21 is inserted into the cavity 18 so that it lies flat against a predetermined portion of the upper side of the heat sink 14. The semiconductor pellet 22 is thereupon introduced into the cavity 18 so as to overlie the foil 21. The dimensions of the cavity 18 are such that the properly inserted parts 21, 22 are automatically located in optimum positions with reference to the heat sink 14 and leads 15, 16. The terminals 26, 27 are accessible at the exposed upper surface of the properly inserted pellet 22. The contacts 23, 24 which serve to conduct current to the corresponding terminals 26, 27 are thereupon slipped onto the upper portions of the leads 15, 16. A further current-conducting connection is established when the assembled semiconductor device is heated so that the foil 21 melts and establishes a current-conducting contact between the pellet 22 and the heat sink 14. That connection between the parts 14 and 22 which is established in response to melting of the foil 21 serves to conduct heat from the pellet into the heat sink when the semiconductor device is in use.

The manner in which the contact 23 can be properly mounted on the upper portion of the lead 15 so as to cause its tongues 28 to bear against the corresponding terminals 26 is illustrated in FIG. 2. The lead 15 extends through the registering apertures 29 of the legs **23*b*, 23*c*. The shoulder 30 (FIG. 1) determines the angular position of the contact 23 with reference to the lead 15 to insure that the foot 28*c* of each tongue 28 bears against a selected terminal 26. In order to make sure that the contact 23 remains in an optimum position during subsequent stages of the assembly (for example, that the contact 23 does not change its angular and/or axial position in response to vibrations), and to further insure that the foot 28*c* of each tongue 28 biases the pellet 22 against the foil 21 and hence against the heat sink 14, the contact 23 consists of an elastic metallic sheet material and can be stressed to the extent determined by the block 12 in order to produce a clamping action which prevents slippage of legs 23*b*, 23*c* upwardly and away from the block 12. Thus, the exertion of a slight pressure against the upper leg 23*b* in a direction toward the block 12 will cause a slight tilting of the legs with reference to the lead 15 so that the contact 23 causes its tongues 28 to bear against the adjacent terminals 26 and that such bias remains unchanged when the manually produced pressure upon the upper leg 23*b* is terminated. This is due to generation of a clamping force which acts between the legs 23*b*, 23*c* and the surface of the lead 23 and which can be readily overcome by exerting a pull on the projection 35. Thus, the person in charge can use pincers or tweezers to engage the projection 35 and to lift the contact 23 off the block 12 if the contact is defective or must be clamped in a different angular position. In the next step, one of the solder rings 25 is slipped onto the lead 15 so that it rests on and overlies the upper leg 23*b***.

The second contact 24 is mounted on and clamped to the lead 16 in the same way as described for the contact 23. When the contact 24 is properly mounted, its tongue 128 bears against the terminal 27 of the pellet 22. A shoulder 130 in the block enables the operator to properly locate the contact 24 in a desired angular position with reference to the lead 16. In the next step, a solder ring 25 is slipped onto the lead 16 so that it comes to rest on the clamped upper leg of the first portion of the contact 24. The operator is then free to remove the block 12 and to withdraw the lower portions of the leads 15, 16 from the holes 17 of the base member 11. This is due to the fact that the first portions of the contacts 23, 24 are clamped to the leads 15, 16 and that the tongues 28, 128 respectively bear against the terminals 26, 27 to bias the pellet 22 and the foil 21 against the heat sink 14. The semiconductor device is then introduced into a soldering furnace to melt the foil 21 and the rings 25 whereby the contacts 23, 24 are permanently secured to the leads 15, 16 and the pellet 22 is soldered to the heat sink 14 while the tongues 28, 128 respectively bear against the terminals 26, 27. The contacts 23, 24 are provided with coats of solder which melts in the furnace to bond the tongue 28, 128 to the respective terminals 26, 27. The metallic sheet material of the contacts 23, 24 is preferably of the type which retains its elasticity at soldering temperatures; this insures that the tongues continue to bear against and are soldered to the respective terminals during heating in the soldering furnace.

The contacts 23, 24 must exhibit a very satisfactory electrical and thermal conductivity. This insures that the rise in temperature which develops as a result of electrical resistance and ensuing heating of contacts during flow of substantial currents cannot affect the connections between the terminals and the tongues. The metallic material of the contacts 23, 24 should have no toxic effects upon the physical structure of the pellet. Also, the recrystallization temperature of each contact should at least equal the soldering temperature; this insures that the tongues continue to bear against the corresponding terminals during heating of the assembly in a soldering furnace to a temperature at which the material of the foil 21 and rings 25 melts. As stated before, each of the tongues 28, 128 is V-shaped and has first and second sections which are respectively bent in a direction away and toward the exposed surface of the pellet 22. This guarantees that, when the tongues 28, 128 expand in response to heating, they cannot excessively stress the soldered connections with the terminals 26 and 27. The tongues 28 are dimensioned in such a way that each thereof applies to the corresponding terminal 26 a force of a given magnitude which is at least nearly identical for all tongues 28 and that such forces are independent of each other, i.e., that one tongue cannot interfere with proper engagement between another tongue and the adjacent terminal 26. Such dimensioning of the tongues can be readily determined by resorting to rules controlling the bending of beams. Each foot 28*c* can compensate for eventual differences in the levels of terminals 26 without exerting an undue tilting action on the contact portion 23*a* during heating in the soldering furnace. The projections 35 of the contacts 23, 24 facilitate manipulation during placing into the cavities 20, 19 and in the event that a contact must be removed and reinserted in a different position.

It was found that a contact 23 or 24 which exhibits the following characteristics can be used with particular advantage in the semiconductor device of the present invention: Its material should be elastic sheet metal consisting of Ag 97 Cu3 with a tensile strength of approximately 40 $Kp/mm^2$, a Vickers hardness $HV_{10}$ of approximately 115 $Kp/mm^2$, a recrystallization temperature of about +600°C., an elasticity modulus of about 5,600 $Kp/mm^2$, a linear thermal expansion coefficient of about $20 \cdot 10^{-6} \cdot (1/°C.)$ and an overall thickness of 0.15 mm. Both sides of the sheet material are preferably coated with a solder having a thickness of about 40 microns and consisting of Pb 96Sn4. The specific electrical resistance of the contact at 20°C. is about $1.94 \cdot 10^{-6}\ \Omega$ cm, the temperature coefficient of resistance $+3.4 \cdot 10^{-3}\ °C.^{-1}$, the the thermal conductivity about 3.5 $W\ cm^{-1}\ °C.^{-1}$, and the temperature coefficient of thermal conductivity about $+5 \cdot 10^{-4}\ °C.^{-1}$.

FIG. 3 illustrates the fully assembled and soldered semiconductor device. The soldered connections are shown at 40. All of these connections are completed in a single step, i.e., the contacts 23, 24 are bonded to the leads 15, 16, the tongues 28, 128 are bonded to the terminals 26, 27 and the pellet 22 is bonded to the heat sink 24 in a single operation. At least the exposed surface of the pellet 22 can be coated with a protective layer of lacquer on the like and the parts at the upper side of the heat sink 14 are thereupon hermetically enclosed in a customary enclosure or can (not shown) which can be welded or soldered to the heat sink. Such can protects the semiconductor device against moisture, dirt, dust and other external influences.

An important advantage of the device shown in FIG. 3 is that the contacts 23, 24 consist of metallic material and are elastically deformed to insure a requisite bias between the parts 28, 128, 22, 21 and 14 prior to and during soldering. This is in contrast to certain presently known procedures according to which the contacts are permanently deformed prior to bonding. An elastically deformed contact can be readily removed to be reinserted in a different position whereas the removal of a permanently deformed contact involves more time and effort, and a permanently deformed contact must be discarded if it was deformed while held in an improper position. The feature that the extent of deformation of contacts 23, 24 can be determined by the jig renders it possible to stress each of a series of contacts 23, 24 to the same degree. For example, the contacts 23, 24 can be deformed by pressing them toward the heat sink 14 until the exposed surfaces of the upper legs of their first portions lie flush with the exposed upper side of the block 12.

Another important advantage of my method and of the jig shown in FIG. 1 is that the semiconductor device can be assembled by unskilled persons. Furthermore, the elastic contacts 23, 24 insure that the tongues 28, 128 bear against the terminals 26, 27 not only prior to but also during heating in the soldering furnace so that the melting of solder does not cause any separation of current-conducting parts. The contacts 23, 24 clamp themselves to the respective leads 15, 16 with a force which suffices to insure proper positioning and retention of contacts during soldering. Furthermore, even if a contact happens to become loose owing to excessive vibration or other types of shocks, it can be readily removed by engaging the corresponding projection 35 to be reinserted in an optimum position for permanent connection to the pellet 22 and the corresponding lead. Contacts of the type shown in FIG. 2 can be used with advantage in transistor amplifiers with several emitters. The tongues of the contact 23 can be arranged in one, two or more rows. Since the tongues are soldered to the respective terminals in stressed condition of the respective contacts, they are capable of establishing satisfactory current-conducting connections in transistor amplifiers which are designed to conduct strong currents. It was found that the novel method of assembling the semiconductor device brings about unexpectedly high savings in time and man hours.

Without further analysis, the foregoing will so fully reveal the gist of the present invention that others can, by applying current knowledge, readily adapt it for various applications without omitting features which fairly constitute essential characteristics of the generic and specific aspects of my contribution to the art and, therefore, such adaptations should and are intended to be comprehended within the meaning and range of equivalence of the claims.

What is claimed as new and desired to be protected by Letters Patent is set forth in the appended claims:

1. In a semiconductor device, a combination comprising a metallic plate-like heat sink; at least one lead anchored in, electrically insulated from and extending transversely beyond at least one side of the heat sink; a semiconductor pellet adjacent to said one side of the heat sink and having an exposed surface provided with at least one terminal; and an electric contact of resilient material having a U-shaped first portion including two legs provided with registering openings through which said one lead extends, and a second portion including at least one tongue engaging said terminal, said contact engaging said lead and said terminal in stressed condition, so that said legs clampingly engage said lead and said tongue presses aid pellet against said one side of said heat sink.

2. A combination as defined in claim 1, wherein said contact consists of a metallic material which retains its elasticity when heated to a soldering temperature.

3. A combination as defined in claim 1, wherein the material of said contact is elastic sheet metal and said contact exhibits the following characteristics:

composition: Ag 97 Cu3;
tensile strength: about 40 $Kp/mm^2$;
Vickers hardness $HV_{10}$: about 115 $Kp/mm^2$;
recrystallization temperature: about +600°C.;
elasticity modulus: about 5,600 $Kp/mm^2$;
linear heat expansion coefficient: about $20 \cdot 10^{-6}$ (1/°C.);
coated on both sides with a film consisting of Pb 96Sn4 having a thickness of about 40 microns;
overall thickness: about 0.15 mm;
specific electric resistance: $1.94 \cdot 10^{-6}\,\Omega$ cm at 20°C.;
temperature coefficient of resistance: about $+3.4 \cdot 10^{-3}$ $°C^{-1}$;
thermal conductivity: about 3.5 W $cm^{-1}$ $°C.^{-1}$;
temperature coefficient of thermal conductivity: about $+5 \cdot 10^{-4}$ $°C.^{-1}$.

4. A combination as defined in claim 1, wherein said contact is provided with at least one projection spaced from said openings which is accessible to the jaws of tweezers or analogous tools.

5. A combination as defined in claim 4, wherein said pellet has a plurality of terminals at said exposed surface thereof.

6. A combination as defined in claim 5, wherein the second portion of said contact consists of several discrete tongues each engaging a terminal of said pellet.

7. A combination as defined in claim 5, wherein said tongue is V-shaped and includes a first section extending from one of said legs away from the surface of said pellet, a second section extending toward said surface, and a foot provided at the free end of said second section and lying flat against a terminal of said pellet.

8. A combination as defined in claim 5, wherein the second portion of said contact comprises at least two tongues located in different planes and each engaging a discrete terminal of said pellet.

9. A combination as defined in claim 8, wherein all of said tongues bear against the respective terminal with a substantially identical force and independently of each other.

* * * * *